United States Patent [19]

Plagens

[11] Patent Number: 5,694,040
[45] Date of Patent: Dec. 2, 1997

[54] MAGNETIC SENSOR CIRCUIT WITH TWO MAGNETICALLY SENSITIVE DEVICES

[75] Inventor: Mark R. Plagens, Richardson, Tex.

[73] Assignee: Honeywell Inc., Minneapolis, Minn.

[21] Appl. No.: 677,436

[22] Filed: Jul. 2, 1996

[51] Int. Cl.$^6$ .............................. G01B 7/14; G01R 33/06
[52] U.S. Cl. ..................... 324/207.2; 324/251; 327/511
[58] Field of Search ........................ 324/117 H, 173, 324/174, 207.12, 207.2, 207.21, 225, 235, 251, 252; 327/510, 511; 341/15

[56] References Cited

U.S. PATENT DOCUMENTS

| | | | |
|---|---|---|---|
| 4,369,405 | 1/1983 | Sato et al. ............................... | 324/174 |
| 4,518,918 | 5/1985 | Avery ...................................... | 324/251 X |
| 4,737,710 | 4/1988 | Van Antwerp et al. ............... | 324/251 X |
| 4,760,285 | 7/1988 | Nelson .................................... | 324/251 X |
| 4,966,041 | 10/1990 | Miyazaki .............................. | 324/207.2 X |
| 5,055,768 | 10/1991 | Plagens ................................. | 324/225 X |
| 5,084,674 | 1/1992 | Lachmann et al. ..................... | 324/174 |
| 5,444,370 | 8/1995 | Wu ......................................... | 324/207.2 |
| 5,552,706 | 9/1996 | Carr ....................................... | 324/252 |

FOREIGN PATENT DOCUMENTS 2176616  12/1986  United Kingdom .

*Primary Examiner*—Gerard R. Strecker
*Attorney, Agent, or Firm*—William D. Lanyi; John G. Shudy, Jr.

[57] ABSTRACT

A magnetic sensor circuit provides current sources that create a feedback loop for an amplifier of one magnetically sensitive component in order to maintain the sensor output and the corresponding amplifier input at a first preselected magnitude which can be generally equal to zero. The other current source maintains a generally identical current as a reference against which the output of another magnetically sensitive component is compared. The magnetically sensitive components can be Hall effect elements, indium antimonide sensors or magnetoresistive elements. The output of the circuit is representative of the difference between the magnetic field intensities imposed on the first and second magnetically sensitive components.

14 Claims, 6 Drawing Sheets

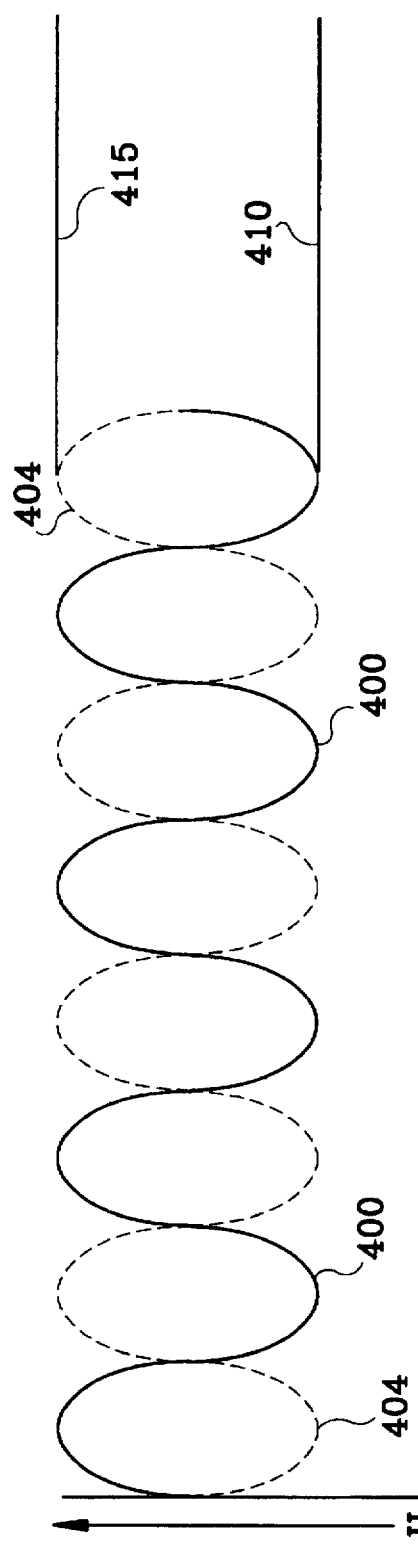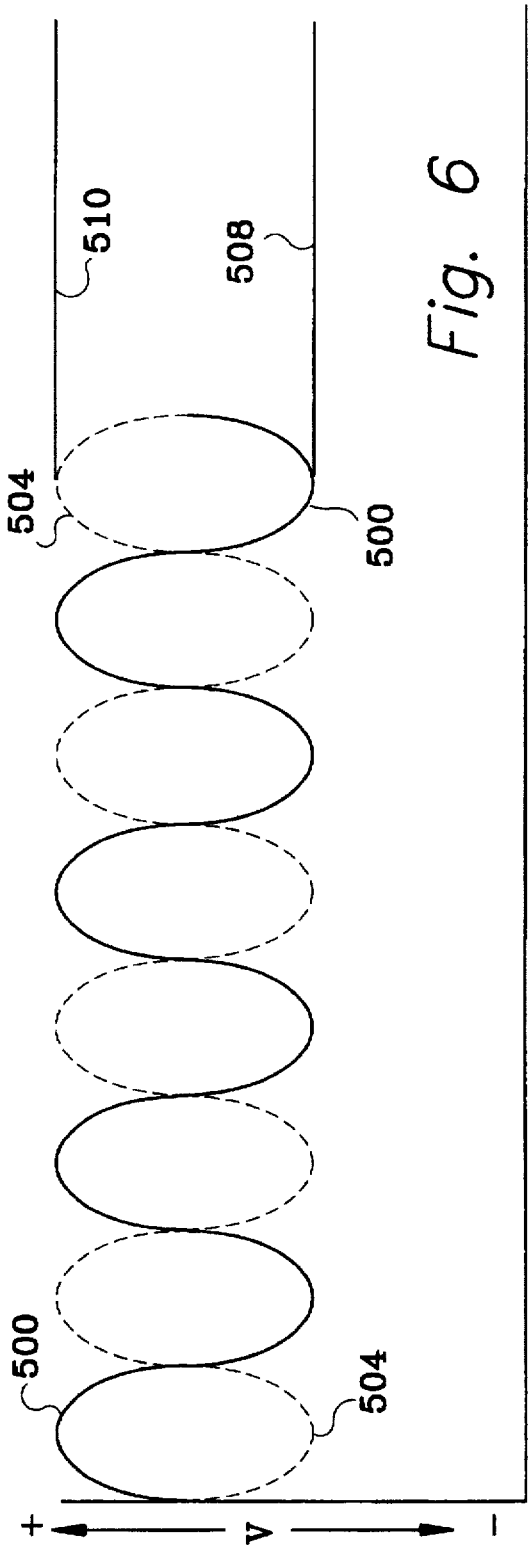

MAGNETIC SENSOR CIRCUIT WITH TWO MAGNETICALLY SENSITIVE DEVICES

BACKGROUND OF THE INVENTION

1. Field of the Invention

The present invention relates generally to a magnetic sensor and, more particularly, to a magnetic sensor circuit with two magnetically sensitive devices in which one of the magnetically sensitive devices is used as a reference to which the other magnetically sensitive device is compared.

2. Description of the Prior Art

Many types of geartooth sensors are known to those skilled in the art. For example, U.S. Pat. No. 5,444,370, which issued to Wu on Aug. 22, 1995, discloses a magnetic angular position sensor with two magnetically sensitive components arranged proximate two target tracks having complementary magnetic and nonmagnetic segments. The magnetic sensor is provided with two target tracks arranged in generally parallel association with each other. Each of the target tracks comprises magnetic and nonmagnetic segments which are arranged in alternating patterns. Each magnetic segment of the first target track is disposed alongside a nonmagnetic segment of the second target track and each magnetic segment of the second target track is disposed alongside a nonmagnetic segment of the first target track. First and second magnetically sensitive components are disposed proximate the first and second target tracks, respectively, and a source of a magnetic field is disposed proximate the first and second magnetically sensitive components. Distortions of the magnetic field imposed perpendicularly on the first and second magnetically sensitive components are used to provide first and second output signals therefrom. A third output signal, which is a function of the first and second output signals, is used to determine the location of the first and second target tracks with respect to the first and second magnetically sensitive components. The magnetic and nonmagnetic segments of the first and second target tracks can be different sizes and arranged in a pattern which permits the specific and absolute location of a movable object to be determined. U.S. Pat. No. 5,084,674, which issued to Lachmann et al on Jan. 28, 1992, describes a circuit configuration having a pair of Hall sensors and a high pass filter for contactless detection of the RPM of a rotating gear wheel. The circuit configuration for contactless detection of the RPM of a rotating gear wheel includes two identical firmly mounted and magnetically prestressed Hall sensors being mutually spaced apart by a center distance equal to one half the tooth pitch of a gear wheel whose RPM is to be detected. Each of the Hall sensors includes at least one pair of identical Hall generators having signal paths and being driven with an impressed control current or impressed control voltage. Voltage to current converters are each coupled to the signal path of a respective one of the Hall generators and each has an output. An evaluation circuit links together the outputs of the voltage to current converters connected to one of the Hall sensors and the outputs of the voltage to current converters connected to the other of the Hall sensors in phase opposition.

United Kingdom Patent Application GB2176616A, which was filed on Jun. 11, 1986 by Loreck, describes a magnetic field responsive device for measuring rotation. To provide a pulsed output signal with a frequency indicative of rotational speed of a toothed wheel spaced from a fixed magnet, the device provides on the face of the magnet a field responsive semiconductor chip comprising an integrated circuit with two Hall generators arranged one after the other in the direction of rotation and associated electrical energy supply, measuring, and evaluation circuits, including a differential amplifier with hysteresis for receiving the Hall signals in order to reduce spurious signals due to vibration. The distance between the two Hall generators should equal or be less than one tooth width. The electric energy supply and the measured signals are conducted via one sole double line.

U.S. Pat. No. 4,369,405, which issued to Sato et al on Jan. 18, 1983, describes a rotational position detecting apparatus. The apparatus includes a rotating member magnetized to induce a large number of magnetic poles on the periphery thereof except at a portion indicative of a rotational reference position, and a pair of magnetically sensitive elements for detecting the magnetic flux from the magnetic poles so as to generate rotational angle signals and reference position signals. The pair of magnetically sensitive elements are positioned side by side such that their output signals generated in response to the magnetic flux from the magnetic poles are different in phase by half the period, and the difference between the outputs of the magnetically sensitive elements is obtained by a differential circuit whose output has an amplitude which is two times the amplitude of the outputs of the magnetically sensitive elements. The magnetic poles on the periphery of the rotating member are dropped out at the reference position in such a manner that the output AC component of the respective magnetically sensitive elements is dropped out at the reference position in a point symmetrical manner on both sides of the zero level of the AC component, thus supplying the rotational angle signals and the reference position signals.

U.S. Pat. No. 4,518,918, which issued to Avery on May 21, 1985, discloses a ferromagnetic article detector with dual Hall sensors. Two identical integrated circuit chips are mounted at a pole of a magnet. Each integrated circuit chip includes a Hall element followed by an amplifier. A comparator is connected to the outputs of the integrated circuit chips to produce a voltage that is directly related to the difference between the magnetic field strengths of the two integrated circuit chips that may be due to a ferromagnetic article that is closer to one integrated circuit chip than the other.

U.S. Pat. No. 4,737,710, which issued to VanAntwerp et al on Apr. 12, 1988, describes a Hall effect array for sensing second spatial derivative of a magnetic field. The sensor apparatus senses the position of a moving body and provides an output signal that is indicative of the position of the moving body. The apparatus includes a predetermined number of Hall effect sensors which are positioned in a straight line and in operating proximity to a moving body made of a ferromagnetic material. A permanent magnet is operatively positioned such that the Hall effect sensors lie in the magnetic field produced by the magnet while the moving body provides a portion of the path comprising the magnetic excitation circuit with the permanent magnet. The moving body includes portions devoid of ferromagnetic material, which causes a change in the magnetic field. The Hall effect sensors sense the absolute value of the magnetic field and because of their particular physical alignment and separation, together with the unique interconnection of the their individual electrical outputs, provide signals to amplifier devices which represent the second time derivatives of the magnetic field sensed by the Hall effect sensors. The electrical outputs of the amplifier devices are provided to a Schmitt trigger comparator which performs the analog to digital conversion of the input signals and provides a digital logic output signal which provides a reference point with respect to the location of the moving body, of the void which causes the change in the magnetic field.

SUMMARY OF THE INVENTION

In applications of magnetic sensors in which two magnetically sensitive components are utilized, the circuit of the present invention provides a sensing arrangement that utilizes a magnetic field imposed on one of the magnetically sensitive components as a reference against which a magnetic field imposed on the other magnetically sensitive component is compared. The circuit of the present invention permits this differential sensing method to be performed through the use of low voltage components. A magnetic sensor circuit made in accordance with the present invention comprises a first magnetically sensitive component which provides a first voltage differential between a first circuit point and a second circuit point. The first voltage differential is representative of a first preselected component of a first magnetic field imposed on the first magnetically sensitive component. The circuit of the present invention also comprises an amplifier which has a first input and a second input. The first circuit point is connected to the first input and the second circuit point is connected to the second input. The circuit of the present invention also comprises a first current source that is connected to the second circuit point. The first current source is connected to the second circuit point and an output of the amplifier for the purpose of forming a feedback loop of the amplifier. The feedback loop of the amplifier is configured to provide a first current through the first current source which causes the second input of the amplifier to maintain a sensor output signal of a first preselected magnitude. The sensor output signal maintained at a zero magnitude is the signal provided to the second input of the amplifier. In a preferred embodiment of the present invention, the first preselected magnitude is generally equal to zero, but the feedback loop of the amplifier may also be configured to provide a slight null voltage as a result of the first current provided by the first current source.

A preferred embodiment of the present invention also comprises a second magnetically sensitive component that provides a second voltage differential between a third circuit point and a fourth circuit point which is representative of a second preselected component of a second magnetic field imposed on the second magnetically sensitive component. The first and second preselected components of the first and second magnetic fields, respectively, can be perpendicular to the plane of the sensor vector components if the magnetically sensitive components are Hall effect elements or components that are magnetoresistive, such as indium antimonide devices. Conversely, the first and second vector components of the first and second magnetic fields can be vector components which are in the plane of the sensor if the first and second magnetically sensitive components are anisotropic magnetoresistive nickel iron compounds. It should be understood the selection of the magnetically sensitive components and the selection of the first and second vector components are not limiting to the present invention. Instead, the primary function of the circuit of the present invention is to receive the signals from the magnetically sensitive components, regardless of the materials selected for the magnetically sensitive components, and use the signal from the first magnetically sensitive component as a reference against which the signal from the second magnetically sensitive component is compared.

The circuit of the present invention further comprises a comparator having a third input, a fourth input and a comparator output. The third circuit point is connected to the third input and the fourth circuit point is connected to the fourth input. The present invention further comprises a second current source that is connected to the fourth circuit point. The second current source is connected to the first current source in order to provide a second current that is generally equal to the first current. The comparator output has a magnitude which is representative of the difference between the first and second components of the first and second magnetic fields.

As mentioned above, the first and second magnetically sensitive components can comprise Hall effect elements, indium antimonide components or magnetoresistive elements. In addition, the first and second preselected vector components of the first and second magnetic fields can be perpendicular to the plane of the magnetically sensitive component or, alternatively, can be within the plane of the magnetically sensitive components. The first input can be an inverting input of the amplifier and the second input can be a noninverting input of the amplifier in one particularly preferred embodiment of the present invention. The third input can be an inverting input of the comparator and the fourth input can be a noninverting input of the comparator in a particularly preferred embodiment of the present invention. The first and second current sources can be connected together in a current mirror configuration and the first preselected magnitude of the first sensor, or magnetically sensitive component, output signal can be generally equal to zero in one particularly preferred embodiment of the present invention.

In a typical application of the present invention, the first magnetically sensitive component is disposed proximate a first target track and the second magnetically sensitive component is disposed proximate a second target track. The first and second target tracks are arranged in parallel association with each other on a movable target structure and each of the target tracks comprises a plurality of ferromagnetic and nonferromagnetic portions. In one particularly preferred embodiment of the present invention, the ferromagnetic and nonferromagnetic portions of the target tracks are arranged in a complementary manner, wherein each ferromagnetic portion of one target track is disposed alongside a nonferromagnetic portion of the other target track.

BRIEF DESCRIPTION OF THE DRAWINGS

The present invention will be more fully and completely understood from a reading of the Description of the Preferred Embodiment in conjunction with the drawings, in which:

FIG. 5 is a hypothetical representation of the changes in magnetic field imposed on first and second magnetically sensitive components;

FIG. 6 represents hypothetical voltage output signals from magnetically sensitive components in response to the magnetic field changes shown in FIG. 5.

DESCRIPTION OF THE PREFERRED EMBODIMENT

Figure 1:
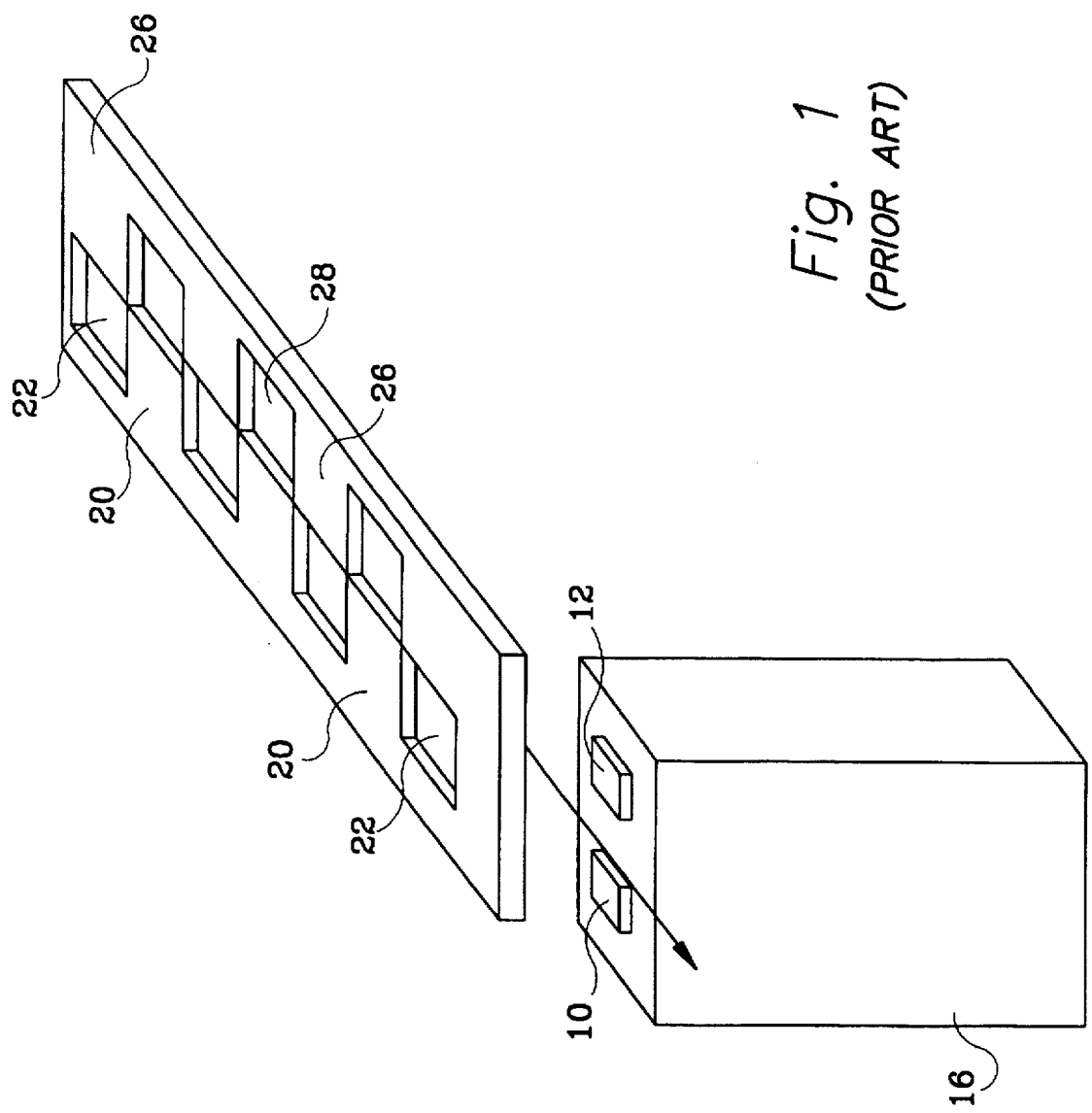
FIG. 1 shows a typical application of a pair of magnetically sensitive components associated with and arranged to sense changes in magnetic field causes by a two track target passing through its detection zones.

Throughout the Description of the Preferred Embodiment, like components will be identified by like reference numerals. In FIG. 1, a first magnetically sensitive component 10 and a second magnetically sensitive component 12 are disposed alongside each other and within the magnetic field provided by a permanent magnet 16. If the magnetically sensitive components, 10 and 12, are Hall effect elements, they provide output signals representing the magnitude of the magnetic field component extending perpendicular to their sensing planes. If, on the other hand, the magnetically sensitive components comprise magnetoresistive elements, they would provide output signals representative of the vector component of the magnetic field extending along the plane of their sensing planes. Above the first and second magnetically sensitive components, 10 and 12, in FIG. 1 is a target that is movable with respect to the magnetically sensitive components. The exemplary target shown in FIG. 1 comprises two target tracks. A first target track, which is positioned to pass over the first magnetically sensitive component 10, comprises ferromagnetic portions 20 and nonferromagnetic portions 22. The second target track, which is positioned to pass over the second magnetically sensitive component 12, comprises ferromagnetic portions 26 and nonferromagnetic portions 28. As can be seen in FIG. 1, the ferromagnetic portions of the first target track are positioned alongside nonferromagnetic portions of the second target track and ferromagnetic portions of the second target track are disposed alongside nonferromagnetic portions of the first target track. This arrangement creates a complementary target that causes the first and second magnetically sensitive components, 10 and 12, to experience complementary reactions as the target moves in the direction of the arrow shown in FIG. 1. In other words, when the first magnetically sensitive component 10 is directly under a ferromagnetic portion 20 of the first target track, the second magnetically sensitive component 12 is disposed directly under a nonferromagnetic portion of the second target track. This complementary arrangement of ferromagnetic and nonferromagnetic target portions permits the magnetic sensor to accurately determine the position of the target as it passes through a detection zone of the sensor. The arrangement shown in FIG. 1 is generally known to those skilled in the art and described in the prior art.

Figure 2:
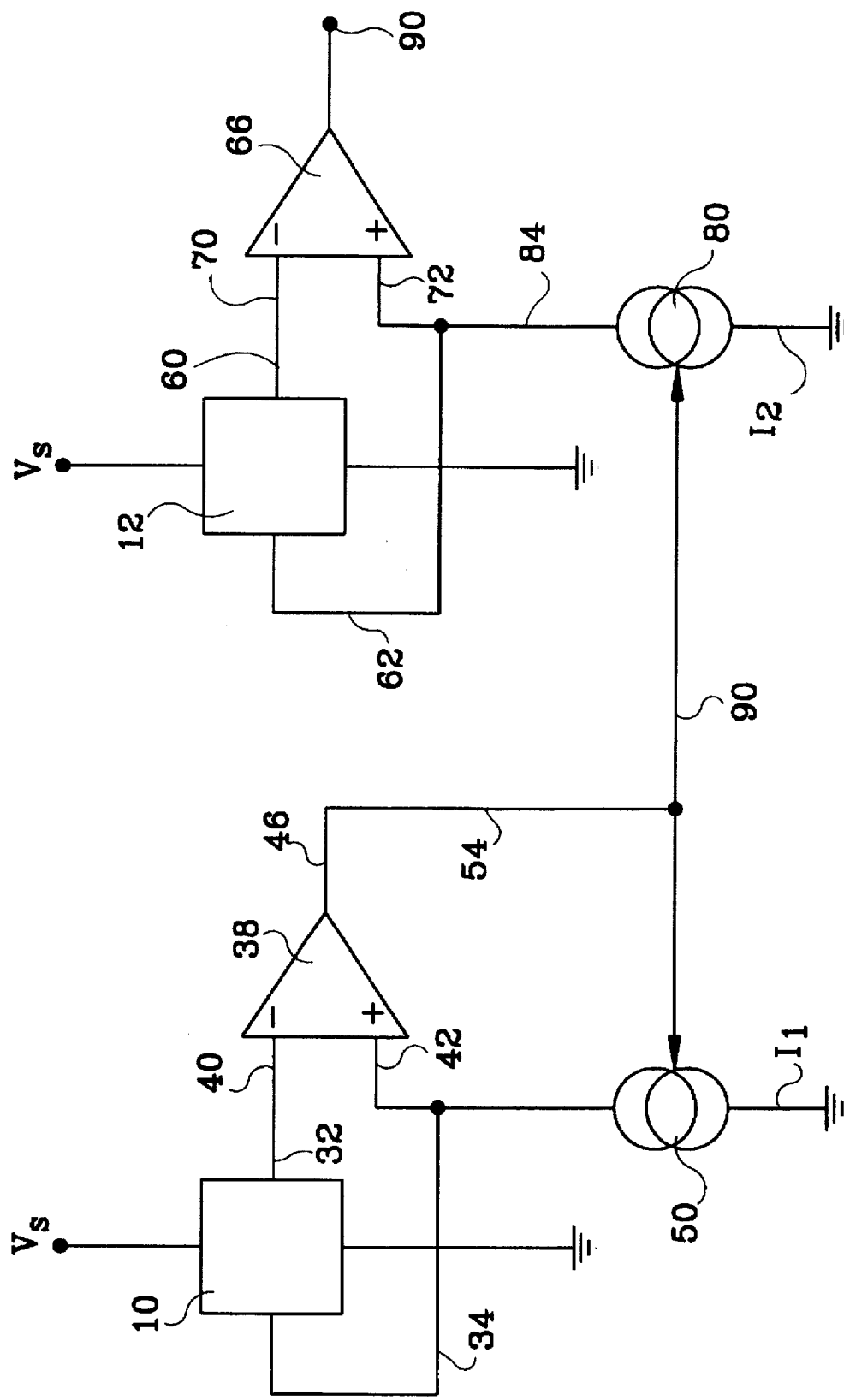
FIG. 2 is a simplified schematic representation of a circuit made in accordance with the present invention.
Figure 3:
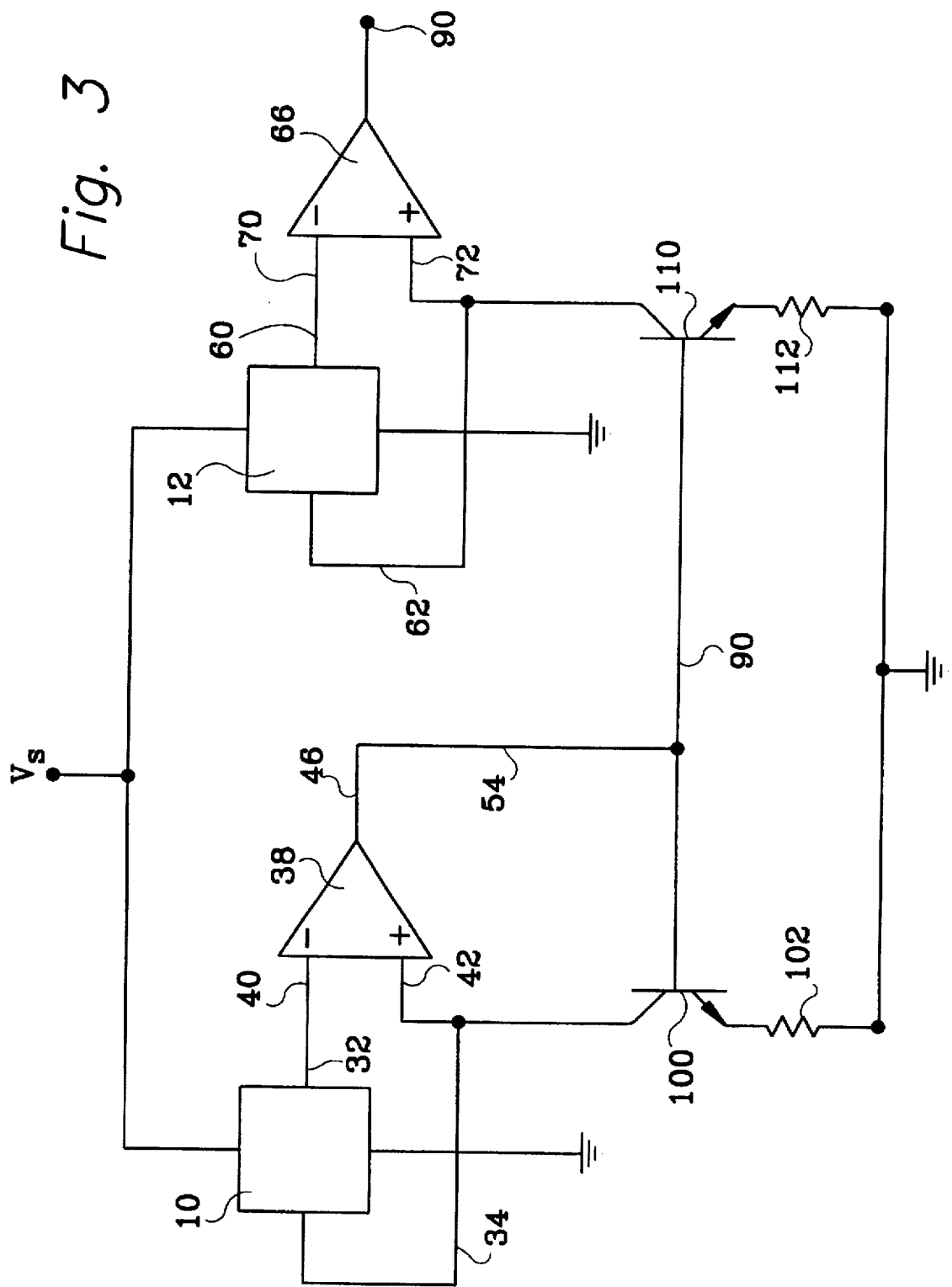
FIG. 3 is an alternative representation of the circuit shown in FIG. 2.
Figure 4:
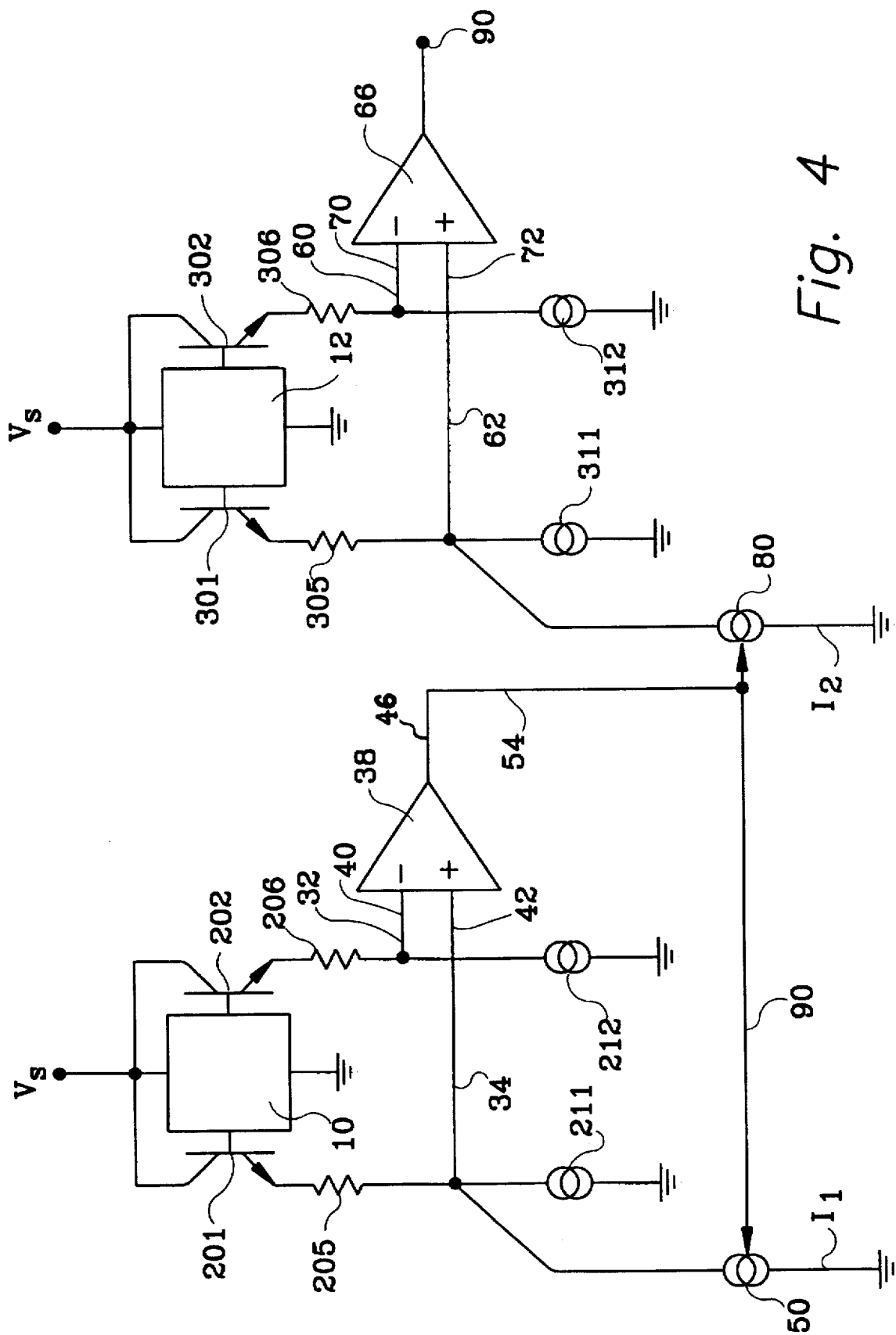
FIG. 4 is a more detailed representation of the circuit shown in FIG. 2 and 3.

FIG. 2 is a simplified schematic illustration of the circuit of the present invention. As can be seen, the first magnetically sensitive component 10 is connected within the circuit to provide a voltage differential between a first circuit point 32 and a second circuit point 34 in response to changes in the magnitude of a perpendicular vector component of a magnetic field imposed on the first magnetically sensitive component 10 if the first magnetically sensitive component is a Hall effect element. FIGS. 2, 3 and 4 will be described in terms of their combination with Hall effect elements as the first and second magnetically sensitive components, 10 and 12. An amplifier 38 is provided with a first input 40 and a second input 42. As shown in FIG. 2, the first input 40 is connected to the first circuit point 32 and the second input 42 is connected to the second circuit point 34. The amplifier has an output 46. In a manner well known to those skilled in the art, the Hall effect element is connected between a supply voltage $V_s$ and a point of ground potential. As is also well known to those skilled in the art, a voltage differential between the first and second circuit points, 32 and 34, is representative of the magnitude of the vector component of the magnetic field extending perpendicular to the plane of the Hall element. A first current source 50 is connected to the second circuit point 34 and to the second input 42 of the amplifier 38. The first current source 50 provides a first current $I_1$ through it. By connecting the output 46 of the amplifier to the first current source 50, as represented by line 54, a feedback loop is created. By appropriately selecting the components related to the feedback loop, the first current source 50 can be caused to maintain a current to the second input 42 which results in a first preselected magnitude at the inputs 40 and 42 of the amplifier.

The second magnetically sensitive component 12 is connected to the circuit in a manner which provides a voltage differential between a third circuit point 60 and a fourth circuit point 62. A comparator 66 has a third input 70 and a fourth input 72. The third input 70 is connected to the third circuit point 60 and the fourth input 72 is connected to the fourth circuit point 62. A second current source 80 is connected to the fourth input 72 and the fourth circuit point 62 as shown. The second current source 80 provides a current $I_2$ through it. This creates a reference at line 84 which is connected to the fourth input 72 of comparator 66. As shown by line 90, the first and second current sources, 50 and 80, are connected together in a mirror circuit that causes the second current $I_2$ to be generally equal to the first current $I_1$. This, in effect, creates a reference at the fourth input 72 of comparator 66 against which the output signal differential between the third circuit point 60 and the fourth circuit point 62 is compared. The reference is generally equal to the first current $I_1$. The output 90 of the comparator 66 is therefore representative of the difference between the magnetic fields imposed on the first and second magnetically sensitive components, 10 and 12.

The feedback loop comprised of amplifier 38 and current source 50 maintains a voltage across sensor 10, at output terminals 34 and 32, of approximately zero volts even in the presence of magnetic fields of several thousand gauss. Slave current mirror 80 also allows sensor 12 to maintain a near zero output across its terminals 60 and 62 when excited with the same, large common-mode magnetic field. Therefore, only the small differential field mismatch between sensors 10 and 12 is impressed as a signal on the inputs to comparator 66. This arrangement eliminates the need for large dynamic range linear amplifiers and summing circuitry to accomplish this operation in the fashion used in prior art. One skilled in the art will also recognize the smaller electrical signals will allow the use of simpler amplifiers and reduced power supply levels for implementation of this circuit approach.

FIG. 3 is operationally similar to FIG. 2, but illustrated with slightly greater detail. In FIG. 3, the first current source is represented by transistor 100 that is connected in series with resistor 102. Similarly, the second current source is shown comprising a second transistor 110 connected in series with a resistor 112. The bases of the first and second transistors, 100 and 110, are connected together and to the output 46 of the amplifier 38. As a result, the currents flowing through the first and second transistors, 100 and 110, are generally equal to each other. Therefore, the first current $I_1$ needed to provide the first preselected magnitude at the output 46 of amplifier 38 will be reflected by the second current $I_2$ flowing through the second transistor 110. This, in effect, will create a reference signal at the fourth input 72 of comparator 66 against which the voltage differential between the third and fourth circuit points, 60 and 62, is compared.

FIG. 4 shows an alternative representation of the circuits described above in conjunction with FIGS. 2 and 3. It should be understood that the circuits shown in FIGS. 2, 3 and 4 are not operationally different from each other but, instead, are illustrated with differing degrees of detail to show how certain functions can be implemented in various embodiments of the present invention. In FIG. 4, the first magnetically sensitive component 10 is connected between the bases of transistors 201 and 202. These two transistors are, in turn, connected in series with resistors 205 and 206. The two resistors, 205 and 206, are connected to the first and second circuit points, 32 and 34. They are also connected to current sources, 211 and 212 as shown.

Transistors 201 and 202 effectively isolate the sensor output terminals from currents flowing in resistors 205 and 206 as provided by current sources 211 and 212 respectively. This allows selection of controlled resistance values (in 205 and 206) independently of the sensor technology constraints, which may improve performance of the circuitry in consideration of temperature or other effects.

With continued reference to FIG. 4, it can also be seen that the second magnetically sensitive component 12 is connected between the bases of transistors 301 and 302. These transistors are, in turn, connected to resistors 305 and 306. Two current sources, 311 and 312 are connected to the resistors, 305 and 306, in a manner generally similar to that described above in conjunction with current sources 211 and 212. The first and second current sources, 50 and 80, perform the functions of providing a second current $I_2$ that is generally equal to the first current $I_1$ which is provided by the first current source 50 for the purpose of creating a preselected output magnitude at the output 46 of amplifier 38 in the manner discussed above. As a result, the output signal at the output 90 of the comparator 66 represents the difference in magnitude of the magnetic fields imposed on the first and second magnetically sensitive components, 10 and 12.

For the purpose of describing an application of the present invention, FIG. 5 represents hypothetical waveforms that indicate the changes in magnetic field intensity imposed on the first and second magnetically sensitive components. For example, waveform 400 represents the generally sinusoidal change in magnetic field intensity through the first magnetically sensitive component 10 as the ferromagnetic and nonferromagnetic portions of the first target track pass over it. Waveform 404, which is shown as a dashed line in FIG. 5, represents the sinusoidal change in magnetic field intensity imposed on the second magnetically sensitive component 12 as the series of ferromagnetic and nonferromagnetic target portions of the second target track pass over it. It should be clearly understood that the magnetic field intensities, represented by lines 400 and 404 in FIG. 5, would typically not be perfectly sinusoidal and that their shapes would depend significantly on many different factors, such as the relative sizes and shapes of the ferromagnetic and nonferromagnetic portions of the target tracks, the types of components used as the first and second magnetically sensitive components and the distance between the movable target and the first and second magnetically sensitive components. However, for the purposes of describing the advantages of the present invention, the sinusoidal shapes shown in FIG. 5 will be used for this discussion. It should be understood that the first and second magnetically sensitive components, 10 and 12, are disposed within the magnetic field of the permanent magnet 16 at all times, whether or not ferromagnetic or nonferromagnetic portions of a target pass through their respective detection zones. Therefore, the lowest magnitude of magnetic field imposed on each of the first and second magnetically sensitive components never reaches zero and is always at a fairly significant magnitude. As an example, the minimum magnitudes of magnetic field H imposed on the first and second magnetically sensitive components and represented by line 410 can be approximately 2000 Gauss in typical applications of magnetic sensors using a bias field provided by a permanent magnet. For purposes of comparison, the maximum magnetic field imposed on the first and second magnetically sensitive components and represented by line 415 can typically be approximately 2200 Gauss. Therefore, the difference between the maximum and minimum magnetic fields imposed on the magnetically sensitive components, and represented by lines 415 and 410 in FIG. 5, can be approximately 200 Gauss or only about 10 percent of the total magnetic field intensity imposed on the components and represented by line 415 in FIG. 5.

If the two magnetically sensitive components, 10 and 12, were not connected by the circuit of the present invention and, instead, totally independent from each other, their amplified outputs would change in response to the changes in magnetic fields imposed upon them. With appropriate biasing circuitry, the amplified outputs of the first and second magnetically sensitive components would provide waveforms such as those hypothetically represented in FIG. 6. For example, the output from the first magnetically sensitive component 10 could appear as line 500 in FIG. 6. The output of the second magnetically sensitive component could appear as dashed line 504 in FIG. 6. Magnetic sensor circuits known to those skilled in the art can provide the signals in the manner represented in FIG. 6 and associated circuitry could compare the two signals to determine the precise position of the target with respect to the sensor and its magnetically sensitive components. The output signals from the two magnetically sensitive components would typically vary between output magnitudes of 60 mV as represented by line 508 and output values of 66 mV as represented by line 510.

Figure 7:
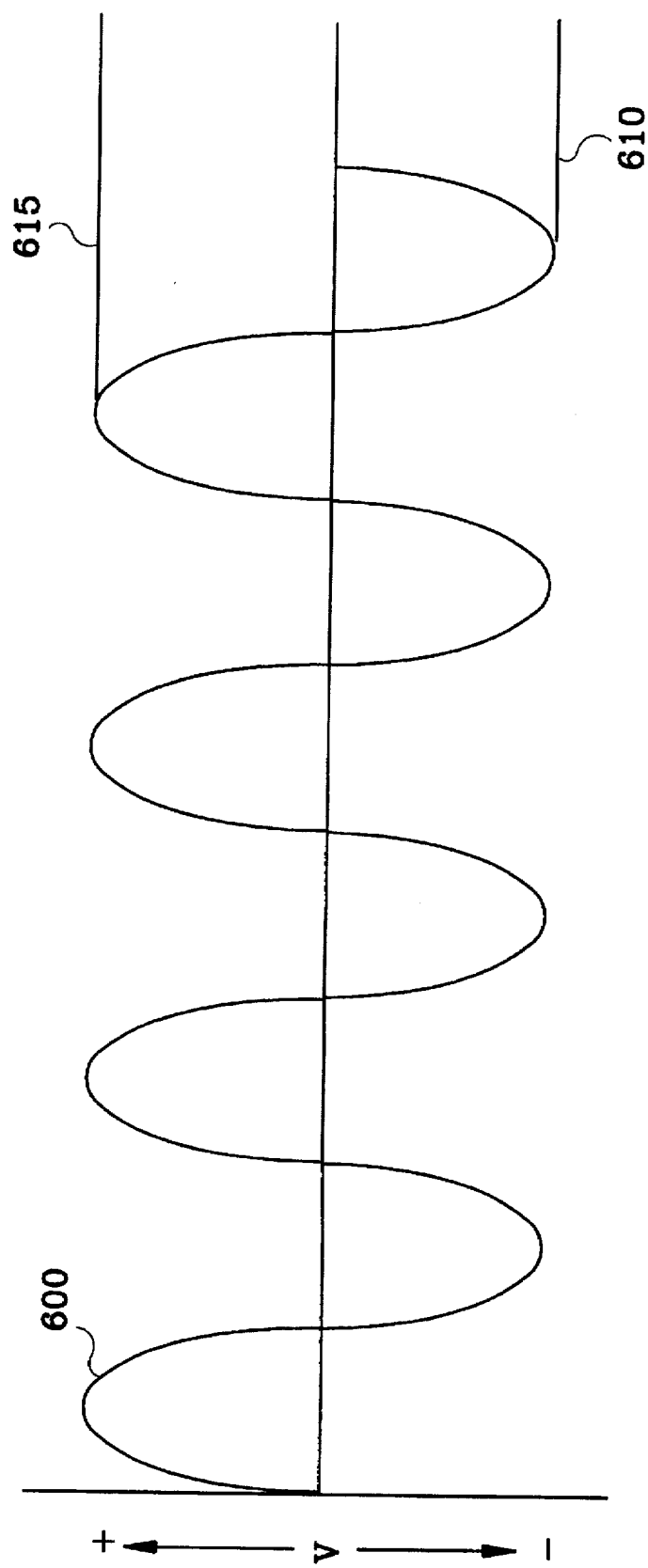
FIG. 7 illustrates the type of output signal provided by a circuit made in accordance with the present invention.

With reference to FIG. 5, it should be understood that the output signals from the first and second magnetically sensitive components in a circuit made in accordance with the present invention are used in a comparison against each other. In addition, since the normal voltage differentials between the first and second circuit points and between the third and fourth circuit points are directly representative of the intensities of magnetic fields imposed on the first and second magnetically sensitive components, respectively, the operation of the present invention is similar to comparing the first and second magnetic field intensities shown in FIG. 5 to each other and providing a single output signal that, in turn, represents the difference between the magnetic field intensities. In other words, if the magnitude of line 404 is continually subtracted from the magnitude of line 400, the resulting output would be generally similar to the operational result of the present invention. FIG. 7 shows this result. In FIG. 7, the output of the second sensor 12 creates a varying magnitude represented by line 600. The maximum amplitude points of line 600 coincide chronologically with the maximum amplitude points of line 400 in FIG. 5. In addition, the minimum amplitude points of lines 600 in FIG. 7 coincide chronologically with the minimum amplitude points of line 400 in FIG. 5. The maximum amplitude of line 600 in FIG. 7 is representative of the difference between the maximum amplitude of line 400 in FIG. 5 relative to the coincident amplitude of line 404 in FIG. 5. For purposes of illustration, the maximum magnitude of the output 90 from the comparator 66, which is represented by line 615 in FIG. 7, can be approximately +6 mV in a typical embodiment of the present invention and the minimum output signal, represented by line 610 in FIG. 7 can be approximately −6 mV.

Although the present invention has been described in terms of certain embodiments in which hypothetical magnetic field intensities and output signal magnitudes have been described, it should be clearly understood that alternative configurations are also within its scope. In addition, although the present invention has been described in terms of the use of Hall effect elements as the first and second magnetically sensitive components, it should be clearly understood that alternative components can be used in conjunction with the circuit of the present invention. The present invention combines an amplifier 38 with a transconductance cell or first current source 50 to form a feedback loop which actively maintains a small null voltage across the output terminals of the first magnetically sensitive component 10 which is disposed in the magnetic field of a permanent magnet. The resulting current $I_1$ flowing through the first current source 50 accomplishes this dynamic zero balancing and the first current is reproduced by a mirror circuit connected to a second current source, a transconductance cell. The arrangement with the first and second current sources, 50 and 80, in combination with the amplifier 38 and the comparator 66 provides a replica biasing circuit.

The advantage of the present invention is that it uses an output from one of the magnetically sensitive components to create a reference signal against which the output from the other magnetically sensitive component is compared. In addition, the reference signal is created by a pair of current sources that are connected in a mirror relationship with each other. The advantages of the present invention can be seen from the above description. Only one precision amplifier with low dynamic voltage range is required. No electronic cell processes signals larger than the differential field value. This allows simpler circuitry and reduced voltage swing requirements. The reduced number of components in the signal path minimizes error sources and also allows improved accuracy.

Although the present invention has been described with particularly specificity and illustrated to show one particularly preferred embodiment, it should be understood that other alternative embodiments are also within its scope.

The embodiments of the invention in which an exclusive property or right is claimed are defined as follows:

1. A magnetic sensor circuit, comprising:
   a first magnetically sensitive component, said first magnetically sensitive component providing a first voltage differential between a first circuit point and a second circuit point which is representative of a first preselected component of a first magnetic field imposed on said first magnetically sensitive component;
   an amplifier having a first input and a second input, said first circuit point being connected to said first input and said second circuit point being connected to said second input; the difference between said first and second amplifier inputs forming a first differential input signal;
   a first current source connected to said second circuit point, said first current source being connected to second circuit point and an output of said amplifier to form a feedback loop of said amplifier, said feedback loop being configured to provide a first current through said first current source which causes said first differential input signal of said amplifier to maintain a first preselected magnitude;
   a second magnetically sensitive component, said second magnetically sensitive component providing a second voltage differential between a third circuit point and a fourth circuit point which is representative of a second preselected component of a second magnetic field imposed on said second magnetically sensitive component;
   a comparator having a third input, a fourth input and a comparator output, said third circuit point being connected to said third input and said fourth circuit point being connected to said fourth input; and
   a second current source connected to said fourth circuit point and said fourth input, said second current source being connected to said first current source to provide a second current that is generally equal to said first current and to provide a reference at said fourth input against which said second voltage differential is compared, said comparator output having a magnitude which is representative of the difference between said first and second components of said first and second magnetic fields.

2. The circuit of claim 1, wherein:
   said first and second magnetically sensitive components comprise Hall effect elements.

3. The circuit of claim 1, wherein:
   said first and second preselected components of said first and second magnetic fields are perpendicular to said first and second magnetically sensitive components, respectively.

4. The circuit of claim 1, wherein:
   said first input is an inverting input of said amplifier and said second input is a noninverting input of said amplifier.

5. The circuit of claim 1, wherein:
   said third input is an inverting input of said comparator and said fourth input is a noninverting input of said comparator.

6. The circuit of claim 1, wherein:
   said first and second current sources are connected together in a current mirror configuration.

7. The current of claim 1, wherein:
   said first preselected magnitude of said first differential input is generally equal to zero.

8. The circuit of claim 1, wherein:
   said first magnetically sensitive component is disposed proximate a first target track and said second magnetically sensitive component is disposed proximate a second target track, said first and second target tracks being arranged in parallel association with each other on a movable target structure.

9. A magnetic sensor circuit, comprising:
   a first magnetically sensitive component, said first magnetically sensitive component providing a first voltage differential between a first circuit point and a second circuit point which is representative of a first preselected component of a first magnetic field imposed on said first magnetically sensitive component;
   an amplifier having a first input and a second input, said first circuit point being connected to said first input and said second circuit point being connected to said second input; the difference between first and second amplifier inputs forming a first differential input signal;
   a first current source connected to said second circuit point, said first current source being connected to said second circuit point and an output of said amplifier to form a feedback loop of said amplifier, said feedback loop being configured to provide a first current through said first current source which causes said first differential input signal of said amplifier to maintain a first preselected magnitude;
   a second magnetically sensitive component, said second magnetically sensitive component providing a second voltage differential between a third circuit point and a fourth circuit point which is representative of a second preselected component of a second magnetic field imposed on said second magnetically sensitive component;

a comparator having a third input, a fourth input and a comparator output, said third circuit point being connected to said third input and said fourth circuit point being connected to said fourth input; and a second current source connected to said fourth circuit point and said fourth input, said second current source being connected to said first current source to provide a second current that is generally equal to said first current and to provide a reference at said fourth input against which said second voltage differential is compared, said comparator output having a magnitude which is representative of the difference between said first and second components of said first and second magnetic fields, said first and second magnetically sensitive components comprising Hall effect elements, said first and second preselected components of said first and second magnetic fields being perpendicular to said first and second magnetically sensitive components, respectively.

10. The circuit of claim 9, wherein:

said first input is an inverting input of said amplifier and said second input is a noninverting input of said amplifier.

11. The circuit of claim 9, wherein:

said third input is an inverting input of said comparator and said fourth input is a noninverting input of said comparator.

12. The circuit of claim 9, wherein:

said first and second current sources are connected together in a current mirror configuration.

13. The circuit of claim 9, wherein:

said first preselected magnitude is generally equal to zero.

14. The circuit of claim 9 wherein:

said first magnetically sensitive component is disposed proximate a first target track and said second magnetically sensitive component is disposed proximate a second target track, said first and second target tracks being arranged in parallel association with each other on a movable target structure.

* * * * *